US012811518B2

(12) United States Patent
Yun et al.

(10) Patent No.: US 12,811,518 B2
(45) Date of Patent: Nov. 24, 2026

(54) SHAPE-VARIABLE ELECTRONIC DEVICE AND OPERATION METHOD OF THE SAME

(71) Applicant: ELECTRONICS AND TELECOMMUNICATIONS RESEARCH INSTITUTE, Daejeon (KR)

(72) Inventors: Sung Ryul Yun, Daejeon (KR); Inwook Hwang, Daejeon (KR); Seongcheol Mun, Daejeon (KR); Jung-Hwan Youn, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 212 days.

(21) Appl. No.: 18/734,084

(22) Filed: Jun. 5, 2024

(65) Prior Publication Data

US 2024/0421729 A1 Dec. 19, 2024

(30) Foreign Application Priority Data

Jun. 13, 2023 (KR) ........................ 10-2023-0075521
Jan. 26, 2024 (KR) ........................ 10-2024-0012561

(51) Int. Cl.
*H02N 10/00* (2006.01)
*F03G 7/06* (2006.01)
(Continued)

(52) U.S. Cl.
CPC ......... *H02N 10/00* (2013.01); *F03G 7/06114* (2021.08); *F03G 7/062* (2021.08); *G06F 3/016* (2013.01); *H10H 29/142* (2025.01)

(58) Field of Classification Search
CPC ........... G06F 3/016; G06F 2203/04809; G09B 21/004; G09B 21/003
(Continued)

(56) References Cited

U.S. PATENT DOCUMENTS 9,017,795 B2 4/2015 Keefe et al.
9,075,525 B2 7/2015 Ciesla et al.
(Continued)

FOREIGN PATENT DOCUMENTS

JP 5007712 B2 8/2012
KR 10-2015-0012400 A 2/2015
WO 2020/153693 A1 7/2020

OTHER PUBLICATIONS

Besse et al., "Understanding Graphics on a Scalable Latching Assistive Haptic Display Using a Shape Memory Polymer Membrane", (IEEE Transaction on Haptics (vol. 11)(No. 1): 30-38 (2018). ) (Year: 2018).*
(Continued)

*Primary Examiner* — Koosha Sharifi-Tafreshi
(74) *Attorney, Agent, or Firm* — LRK PATENT LAW FIRM

(57) ABSTRACT

Provided are a shape-variable electronic device and an operation method of the same. More specifically, the shape-variable electronic device includes a substrate having a cell region, a light source on the cell region, a flexible layer provided vertically spaced apart from the light source part, a chamber between the light source part and the flexible layer, and a pressure control unit configured to adjust an internal pressure of the chamber. The flexible layer includes a photo-thermal response part configured to emit thermal energy by receiving light emitted from the light source part,
(Continued)

and a deformation part of which mechanical stiffness is decreased by receiving the thermal energy from the photothermal response part.

13 Claims, 16 Drawing Sheets

(51) Int. Cl.
*G06F 3/01* (2006.01)
*H10H 29/14* (2025.01)

(58) Field of Classification Search
USPC ........................................ 340/407.1; 715/702
See application file for complete search history.

(56) References Cited

U.S. PATENT DOCUMENTS

| | | | | |
|---|---|---|---|---|
| 10,437,340 | B1 * | 10/2019 | Sullivan | G01K 13/20 |
| 11,275,444 | B2 | 3/2022 | Yun et al. | |
| 11,286,964 | B2 | 3/2022 | Mun et al. | |
| 2009/0174687 | A1 | 7/2009 | Ciesla et al. | |
| 2010/0103137 | A1 * | 4/2010 | Ciesla | G06F 3/04895 345/174 |
| 2010/0171393 | A1 * | 7/2010 | Pei | F03G 7/0121 359/566 |
| 2010/0177050 | A1 | 7/2010 | Heubel et al. | |
| 2017/0336869 | A1 | 11/2017 | Khoshkava et al. | |
| 2018/0003319 | A1 * | 1/2018 | Besse | F16K 99/0015 |
| 2019/0346924 | A1 * | 11/2019 | Han | G06F 3/016 |
| 2019/0348596 | A1 * | 11/2019 | Pelssers | H10N 30/204 |
| 2021/0316446 | A1 * | 10/2021 | Leroy | G06F 3/014 |
| 2021/0365121 | A1 * | 11/2021 | Yun | G06F 3/016 |
| 2022/0165642 | A1 * | 5/2022 | Chen | G06F 3/016 |

OTHER PUBLICATIONS

Choonghyun Son et al., "A flexible multimodal tactile display array for virtual shape and texture", Microsystem Technologies, vol. 22, 2587-2594, 2015.

Nadine Besse et al., "Flexible Active Skin: Large Reconfigurable Arrays of Individually Addressed Shape Memory Polymer Actuators", Advanced Materials Technology, vol. 2, 1700102, 2017.

Renhong Liang et al., "High-Temperature Flexible Transparent Heater for Rapid Thermal Annealing of Thin Films", Physical Review Applied, 17, 044049 (2022), p. 1-12, Apr. 26, 2022.

* cited by examiner

SHAPE-VARIABLE ELECTRONIC DEVICE AND OPERATION METHOD OF THE SAME

CROSS-REFERENCE TO RELATED APPLICATIONS

This U.S. non-provisional patent application claims priority under 35 U.S.C. § 119 of Korean Patent Application Nos. 10-2023-0075521, filed on Jun. 13, 2023, and 10-2024-0012561, filed on Jan. 26, 2024, the entire contents of which are hereby incorporated by reference.

BACKGROUND

1. Field of the Invention

The present disclosure herein relates to a shape-variable electronic device and an operation method of the same, and more particularly, to a shape-variable display and an operation method of the same.

2. Description of Related Art

Recently, due to the rapid development and spread of a touch screen-based electronic device, a planar touch interface that works with a graphical user interface (GUI) is becoming popular all over the world. Currently, most planar touch interfaces only provide tactile feedback in the form of transmitting vibration to the user's finger when the user touches the surface thereof with his or her finger.

Recently, a technology that controls a dynamic driving signal of an actuator (e.g., a motor or voice coil) to provide the feeling of clicking a button, or a technology that varies the intensity of tactile feedback according to contact force, has been proposed.

SUMMARY

The present disclosure provides a shape-variable electronic device that has excellent deformation controllability and implements various shapes and texture.

The present disclosure also provides an operation method of the shape-variable electronic device.

An embodiment of the inventive concept provides a shape-variable electronic device including a substrate having a cell region, a light source on the cell region, a flexible layer provided vertically spaced apart from the light source part, a chamber between the light source part and the flexible layer, and a pressure control unit configured to adjust an internal pressure of the chamber. The flexible layer includes a photo-thermal response part configured to emit thermal energy by receiving light emitted from the light source part, and a deformation part of which mechanical stiffness is decreased by receiving the thermal energy from the photo-thermal response part.

In an embodiment of the inventive concept, an operation method of a shape-variable electronic device comprising emitting light from a light source part to a photo-thermal response part, the photo-thermal response part generating thermal energy by receiving the light, heating the deformation part using the thermal energy, the deformation part being heated to decrease mechanical stiffness thereof, and changing a shape of the deformation part by increasing an internal pressure with a pressure control unit.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
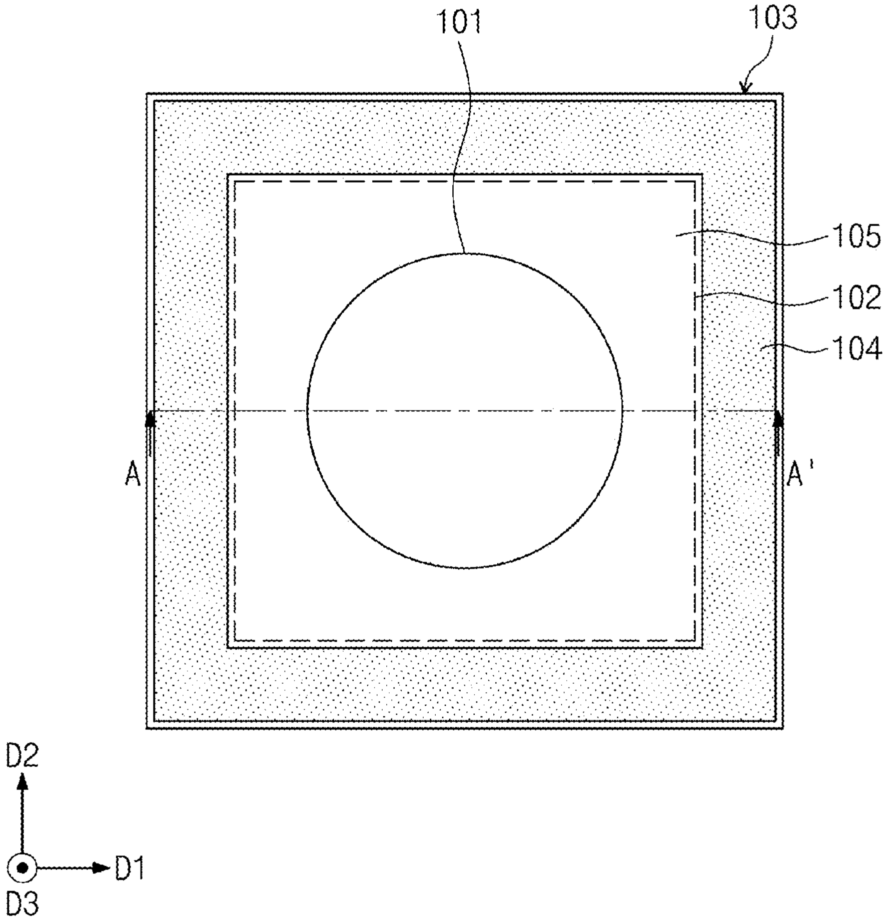
FIG. 1 is a plan view for describing a shape-variable display according to an embodiment of the inventive concept.

In order to fully understand the configuration and effects of an embodiment of the inventive concept, preferred embodiments of the inventive concept will be described with reference to the accompanying drawings. However, the embodiment of the inventive concept is not limited to the embodiments disclosed below, but may be implemented in various forms and various changes may be made thereto. However, the embodiment of the inventive concept is provided to make the disclosure of the embodiment of the inventive concept complete through the description of the embodiments and to fully inform those skilled in the art of the embodiment of the inventive concept of the scope of the invention.

In this specification, when a component is mentioned as being on another component, it means that the component may be formed directly on the other component or a third component may be interposed between them. In addition, in the drawings, the thickness of components is exaggerated for effective explanation of technical content. Portions indicated with the same reference numerals throughout the specification indicate the same components.

In various embodiments of this specification, terms such as first, second, and third are used to describe various components, but these components should not be limited by these terms. These terms are merely used to distinguish one component from another. Embodiments described and illustrated herein also include complementary embodiments thereof.

The terms used in this specification are for describing embodiments and are not intended to limit the embodiment of the inventive concept. In this specification, a singular form includes a plural form unless specifically stated otherwise in the context. The component referred to in terms "comprises" and/or "comprising" as used in the specification do not preclude the existence or addition of one or more other components.

A shape-variable electronic device of the embodiment of the inventive concept may include various electronic devices having a flexible layer of which shape changes. Hereinafter, a shape-variable display as an example of the shape-variable electronic device according to embodiments of the inventive concept will be described in detail.

FIG. 1 is a plan view for describing a shape-variable display according to embodiments of the inventive concept. FIGS. 2A to 2D and 3A to 3D are cross-sectional views taken along line A-A'.

Referring to FIGS. 1 to 3, a substrate 103 having a cell region 102 may be provided. A light source part 101 may be provided on the cell region CEL of the substrate SUB. The light source part 101 may include an element capable of emitting light, for example, an LED or an OLED. From a plan view, the light source part 101 may be provided in the cell region 102. The light source part 101 may have various shapes, but is illustrated in the form of a circle in FIG. 1.

As an example, the light source part 101 may include one light-emitting device (e.g., LED). As another example, the light source part 101 may include a plurality of light emitting elements (e.g., a plurality of micro LEDs).

A surrounding support part 104 may be provided on the substrate 103. A flexible layer 105 supported by the support part SUP may be provided on the cell region 102. From a plan view, the support part SUP may surround the flexible layer 105. The flexible layer 105 may be spaced apart from the light source part 101 in a vertical direction (i.e., a third direction D3) by the support part 104. The flexible layer 105 may include a plurality of stacked layers. Each of the plurality of layers constituting the flexible layer 105 may be made of a flexible material so that its shape may be deformed. The flexible layer 105 may include a photo-thermal response part 202 and a deformation part 201.

The photo-thermal response part 202 may contain a photo-thermal material capable of absorbing light (e.g., visible light or infrared light) and emitting heat. For example, the photo-thermal response part 202 may contain PEDOT (poly(3,4-ethylenedioxythiophene)), PEDOT:PSS (poly(3,4-ethylenedioxythiophene)-poly(styrene sulfonate)) or PEDOT/Metallic particle composite. As another example, the photo-thermal response part 202 may contain carbon-elastomer composite (e.g., Graphene nanoplatelet/elastomer composite). The photo-thermal response part 202 may have elasticity, which is the property of being deformed when receiving force from the outside and returning to its original shape when the force is removed.

The deformation part 201 may include a dielectric polymer layer having bistable characteristics whose mechanical property changes depending on temperature. Since the deformation part 201 has bistable characteristics, it has high mechanical stiffness at room temperature, but the mechanical stiffness thereof may be rapidly lowered at a specific temperature or more. That is, at room temperature, the deformation part 201 may become rigid, and at a specific temperature or more, the deformation part 201 may be flexible.

The term "mechanical stiffness" used in the embodiment of the inventive concept may be a value obtained by measuring resistance to deformation of the shape of the deformation part 201. For example, referring to FIGS. 2C and 3C, the mechanical stiffness may be expressed as a ratio (i.e., pressure/distance) of pressure 208 to a distance 209 that the deformation part 201 protrudes in the third direction D3 when the pressure 208 in the third direction D3 acts on the deformation part 201.

If the pressure 208 acts in the third direction D3 and no deformation occurs in the deformation part 201, the protruding distance 209 is about 0, and therefore the value of the mechanical stiffness of the deformation part 201 in this case may be very large, approaching infinity.

If the pressure 208 acts in the third direction D3 and thus the deformation part 201 is bent in the third direction D3, the protruding distance 209 may have a specific value. The value of mechanical stiffness in this case may be significantly decreased compared to the case where the protruding distance 209 described above is about 0.

The deformation part 201 may contain a shape memory polymer. For example, the shape memory polymer may be selected from the group consisting of PTBA (poly(tert-butyl acrylate)), tert-butyl acrylate copolymer, and stearyl acrylate polymer.

A chamber 203 between the light source part 101 and the flexible layer 105, and a pressure control unit that adjusts the internal pressure of the chamber 203 may be provided.

Figure 2A:
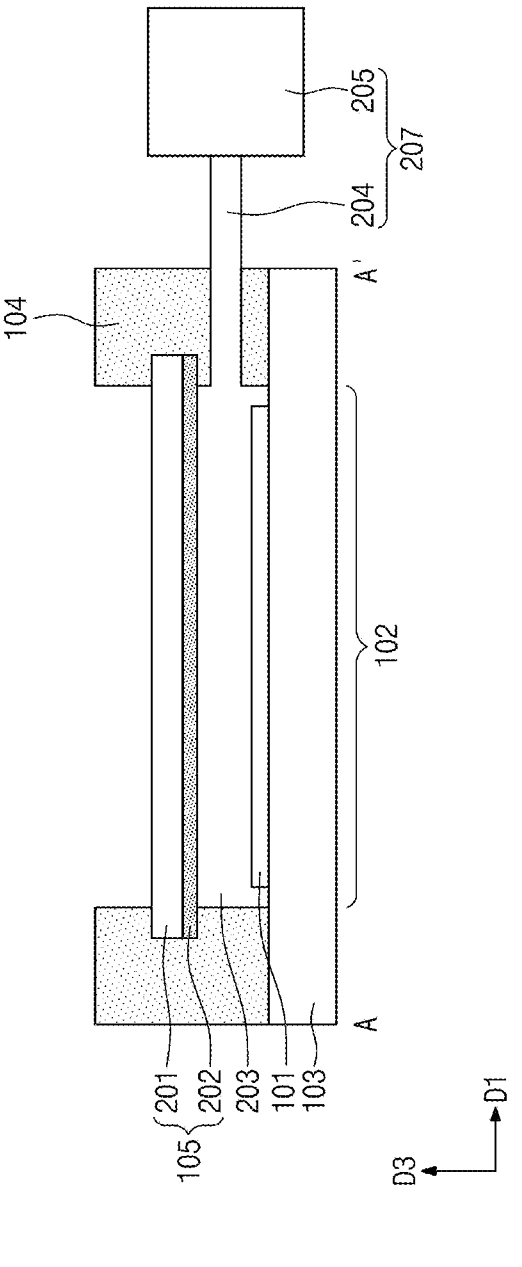
FIGS. 2A and 3A are cross-sectional views taken along line A-A' in FIG. 1.

Referring to FIG. 2A as an embodiment of the inventive concept, the pressure control unit 207 may include a pipe 204 in communication with the inside of the chamber 203 and a pump 205 that controls the internal pressure of the chamber 203 by being connected to the pipe 204. Since the pump 205 is only required for on/off control and does not require precise control of the pressure, a micro pump may be used.

Figure 3A:
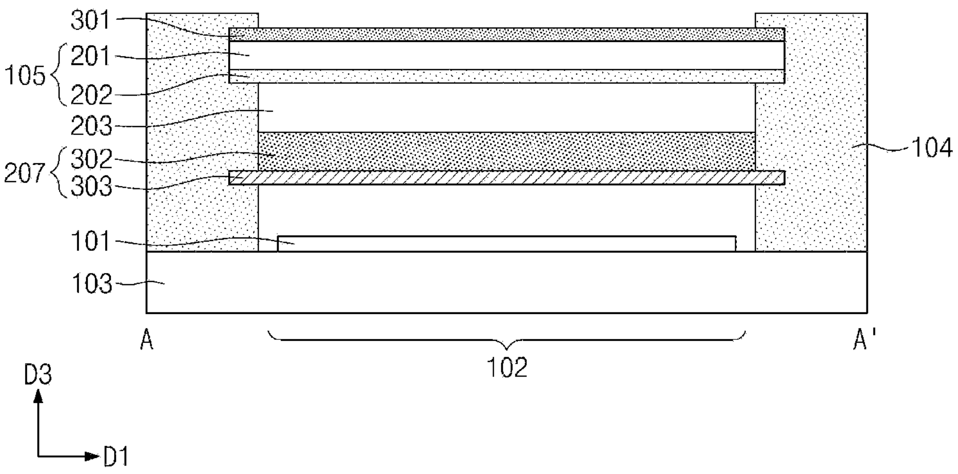

Referring to FIG. 3A as another embodiment of the inventive concept, the pressure control unit may include a heating electrode 303 between the light source part 101 and the flexible layer 105 and a volatile layer 302 on the heating electrode 303. The volatile layer 302 may contain a liquid material capable of being undergone a reversible vaporization-liquefaction conversion. The liquid material may be a material having a low vaporization temperature and may include, for example, NOVEC 7500.

Therefore, at room temperature, the liquid state is maintained and no increase in pressure occurs, but when the heating electrode 303 is heated and releases thermal energy 304, the liquid material may evaporate into a gaseous state 305, and the internal pressure of the chamber 203 may increase. The heating electrode 303 may be heated by a Joule heating method, which has a high heating rate.

Since light LIG emitted from the light source unit 101 should reach a local region of the photo-thermal response part 202, it is not preferable that the heating electrode 303 located between the light source unit 101 and the photo-thermal response part 202 reflects or absorbs light.

Figure 10A:
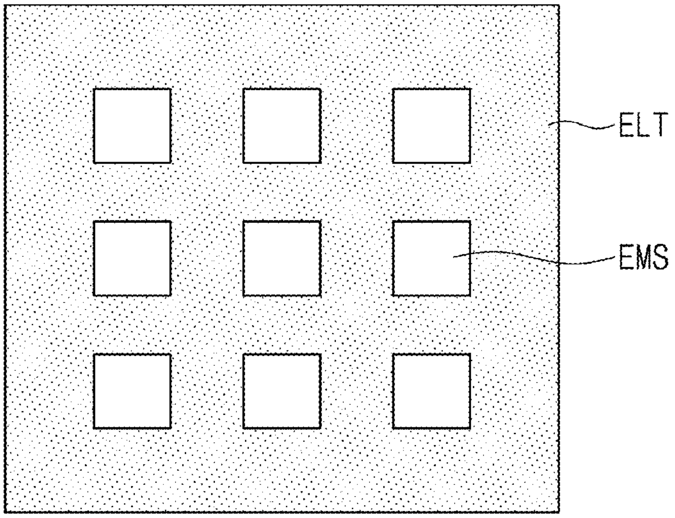
FIGS. 10A and 10B are plan views respectively illustrating examples of heating electrodes according to an embodiment of the inventive concept.
Figure 10B:
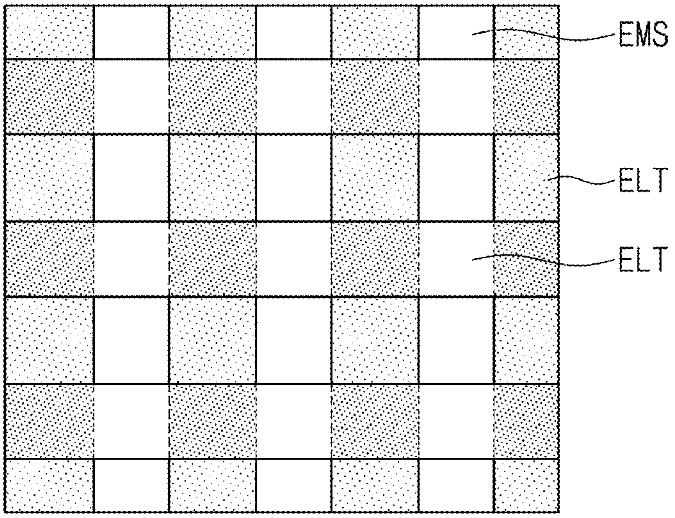

Therefore, as the heating electrode 303, a patterned metal that allows light to be transmitted without reducing the intensity of light 306 may be used. The shape of the pattern is not limited to one. Referring to FIGS. 10A and 10B, the pattern shape may be one having a sufficient heat generation area so that the liquid material of the volatile layer 302 may be sufficiently vaporized without forming an electrode in a region EMS through which the emitted light 306 is transmitted.

In addition, as the heating electrode 303, an electrode of which thermal conductivity is excellent and which has a nanometer thickness may be used so as to have high light transmittance in the visible and near-infrared regions. The thickness of the heating electrode 303 may be about 100 nm to about 1 μm, for example, about 100 nm to about 700 nm, about 300 nm to about 700 nm, or about 300 nm to about 500 nm.

FIGS. 2B to 2D and FIGS. 3B to 3D are cross-sectional views for describing the operations of the shape-variable display according to embodiments of the inventive concept. FIG. 4 is a plan view of the shape-variable display of which shape is changed according to embodiments of the inventive concept.

Figure 2B:
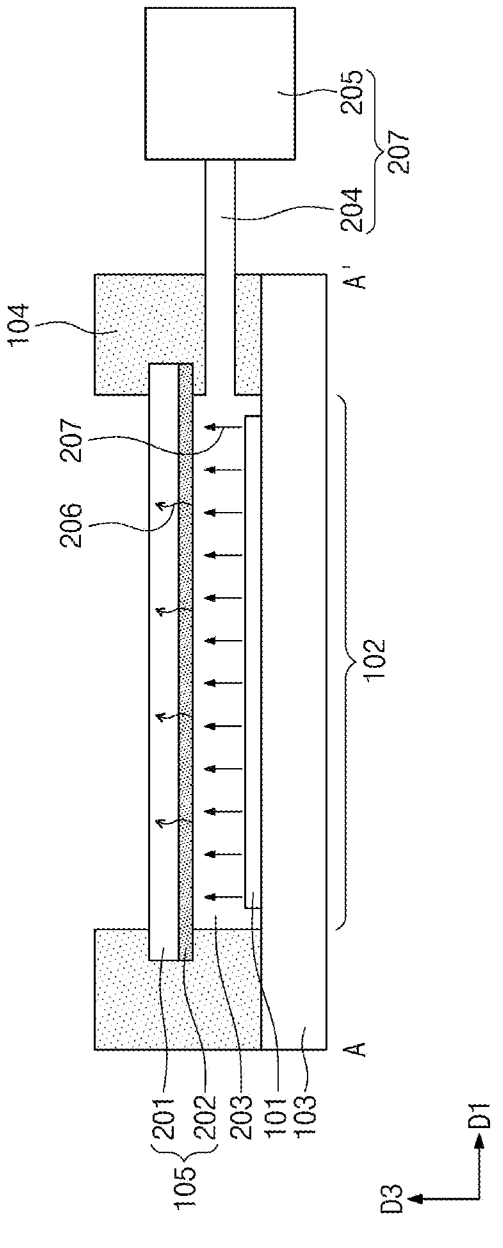
FIGS. 2B to 2D and FIGS. 3B to 3D are cross-sectional views taken along line A-A' in FIG. 1 for describing operations of the shape-variable display according to an embodiment of the inventive concept.
Figure 3B:
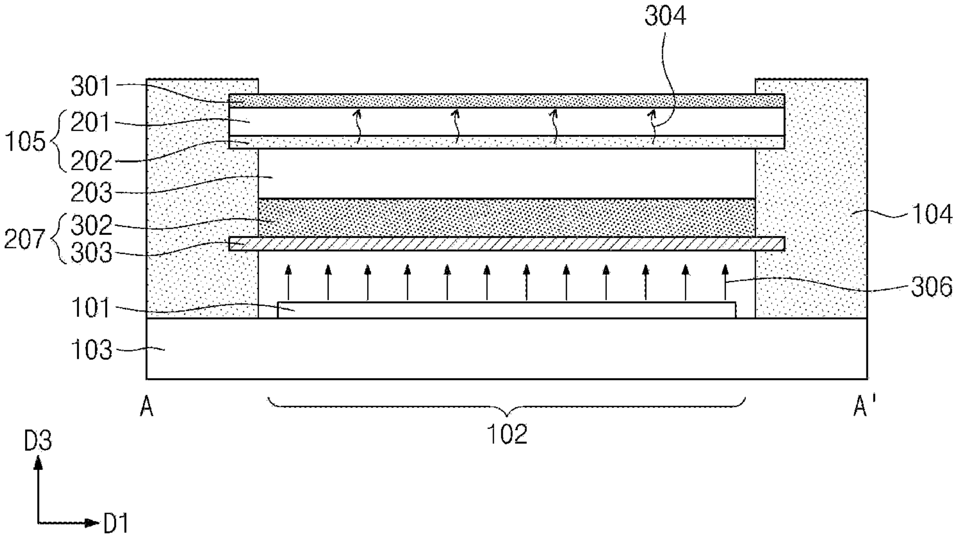
Figure 4:
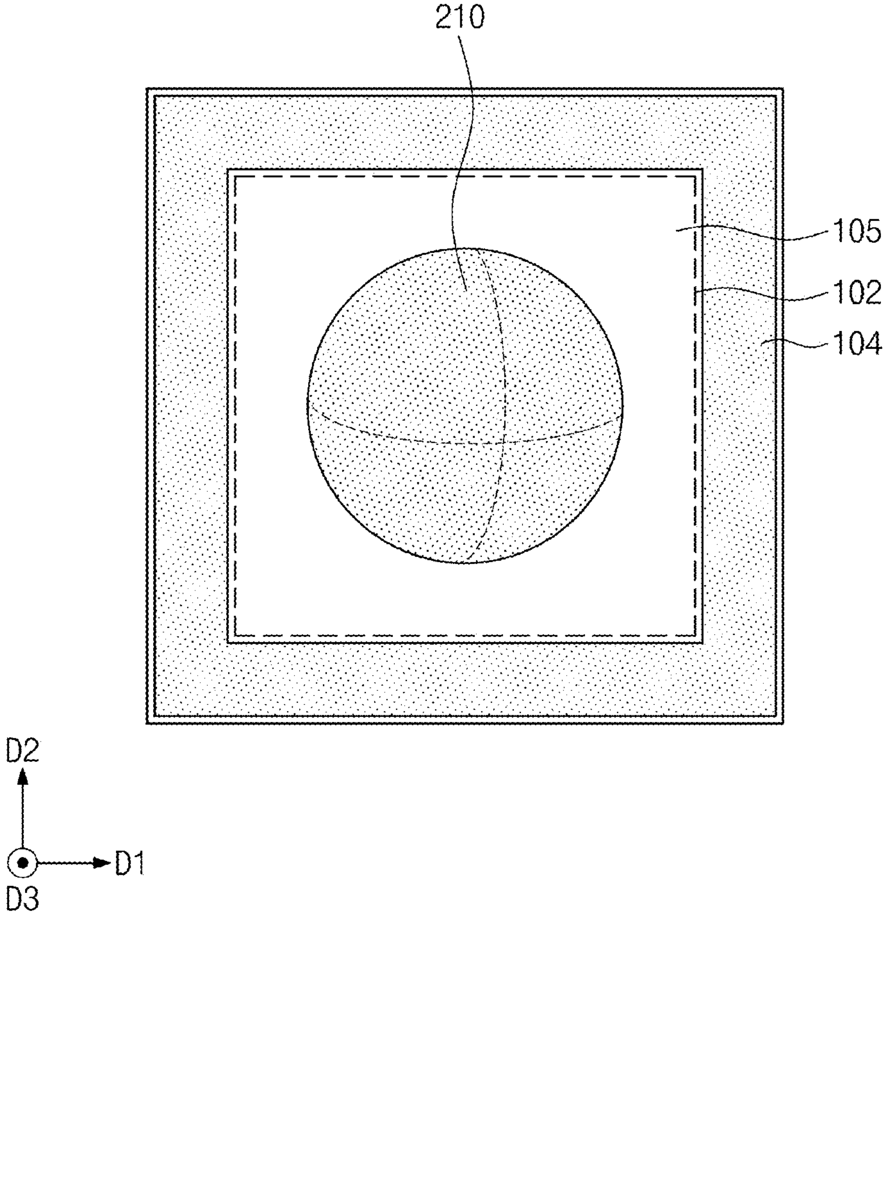
FIG. 4 is a plan view of a shape-variable display of which shape is changed according to an embodiment of the inventive concept.

Referring to FIGS. 2B and 3B, light 306 is emitted from the light source part 101 and the photo-thermal response part 202 may be irradiated with the light 306. The photo-thermal response part 202 may emit thermal energy 304 in response to incident light 306. In this case, an amount of thermal energy 304 emitted from the photo-thermal response part 202 may vary depending on the intensity of light 306 applied. In other words, as the intensity of the light 306 applied to the photo-thermal response part 202 becomes stronger, the amount of thermal energy 304 emitted from the photo-thermal response part 202 may increase. The thermal energy 304 emitted from the photo-thermal response part 202 may be delivered to the deformation unit 201.

The temperature of the deformation part 201 may rise due to the delivered thermal energy 304. As the temperature of the deformation part 201 rises to a specific temperature or more, the mechanical stiffness of the deformation part 201 may be lowered. The mechanical stiffness of the deformation part 201 may be lowered in proportion to the thermal energy 304 delivered to the deformation part 201. In other words, as the thermal energy 304 delivered to the deformation unit 201 increases, the deformation part 201, which is made rigid, may be more flexibly changed.

Figure 2C:
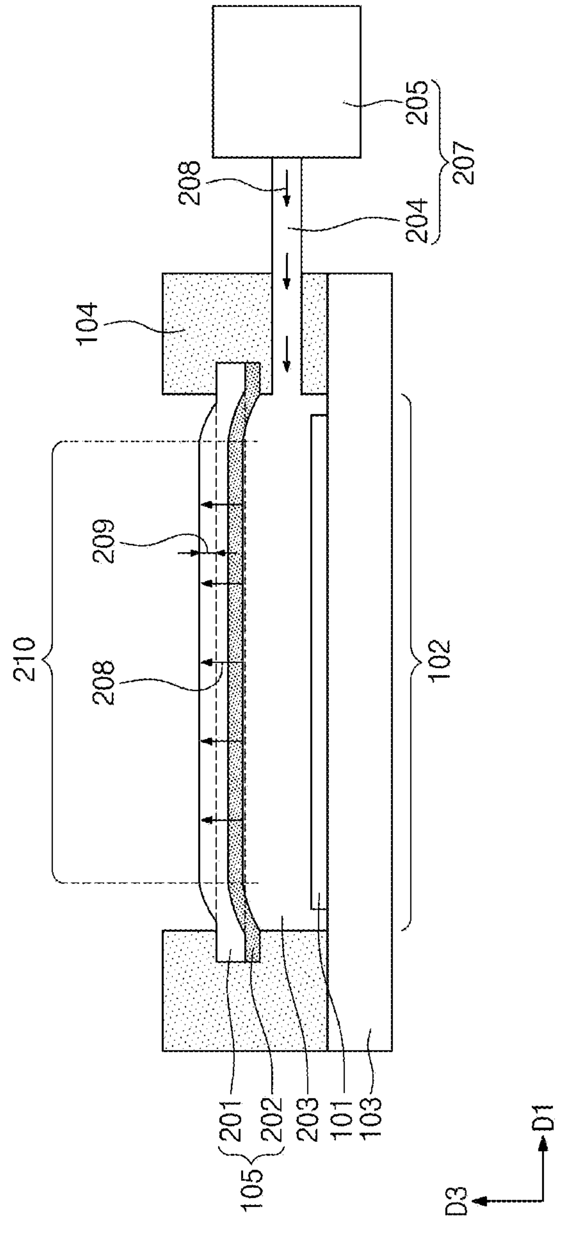

Referring to FIG. 2C, pressure may be applied into the chamber 203 through the pipe 204 connected to the pump 205. The shape of the deformation part 201, which is made flexible, may be changed by applied pneumatic pressure. For example, buckled deformation may occur in the deformation part 201 in the third direction D3.

Figure 3C:
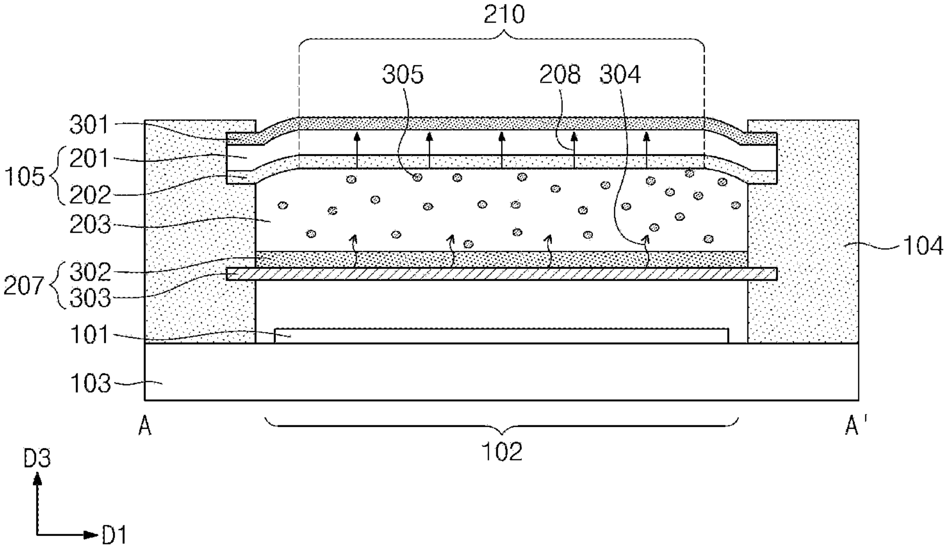

Referring to FIG. 3C as another embodiment of the inventive concept, the liquid material in the volatile layer 302 may be vaporized by heating the heating electrode 303. As the liquid material becomes a gaseous state 305, the internal pressure of the chamber 203 may increase. The shape of the deformation part 201, which is made flexible, may be changed due to the increased internal pressure of the chamber 203. For example, buckled deformation in the third direction D3 may occur in the deformation part 201.

Referring to FIGS. 2C and 3C, as the shape of the deformation part 201 changes, a protruding region 210 protruding in the third direction D3 may be formed in the flexible layer 105. The protruding region 210 may have a circular button shape corresponding to the planar shape of the light source part 101.

As described above, the mechanical stiffness of the deformation part 201 may be adjusted by adjusting the intensity of the light 306 emitted from the light source part 101. If the mechanical stiffness varies, the degree of change when applying the same pressure 208 may vary. Therefore, even if the magnitude of the pressure 208 applied to the chamber is not adjusted, the degree of protrusion 209 of the protruding region 210 may be precisely adjusted by adjusting the intensity of the light 306.

Figure 2D:
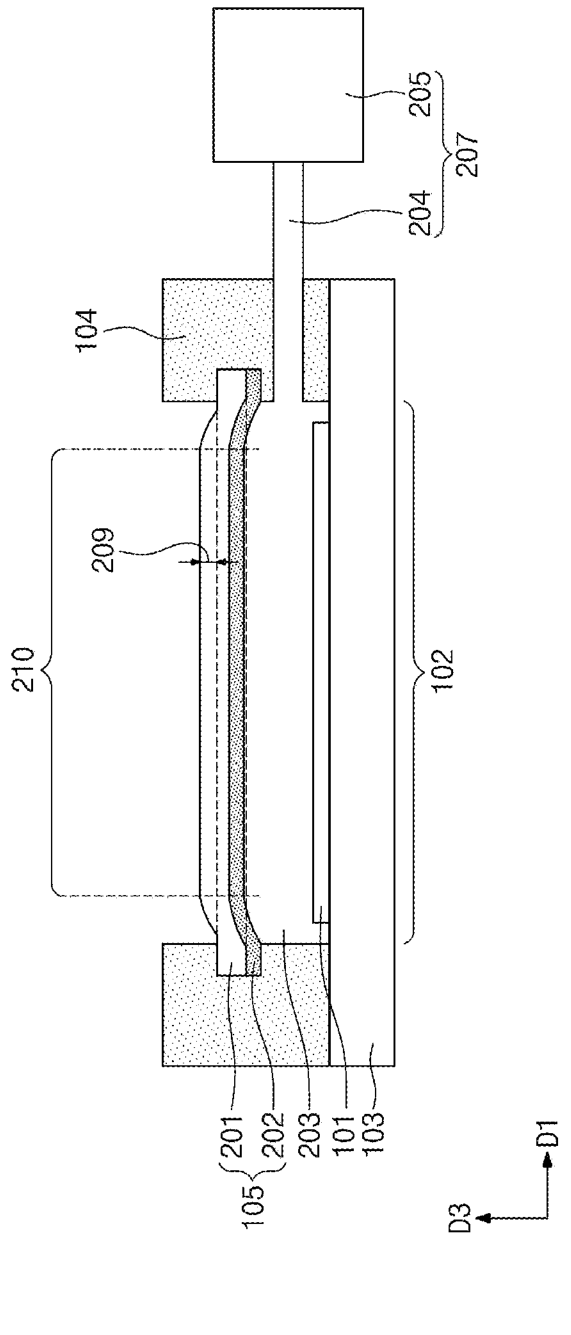
Figure 3D:
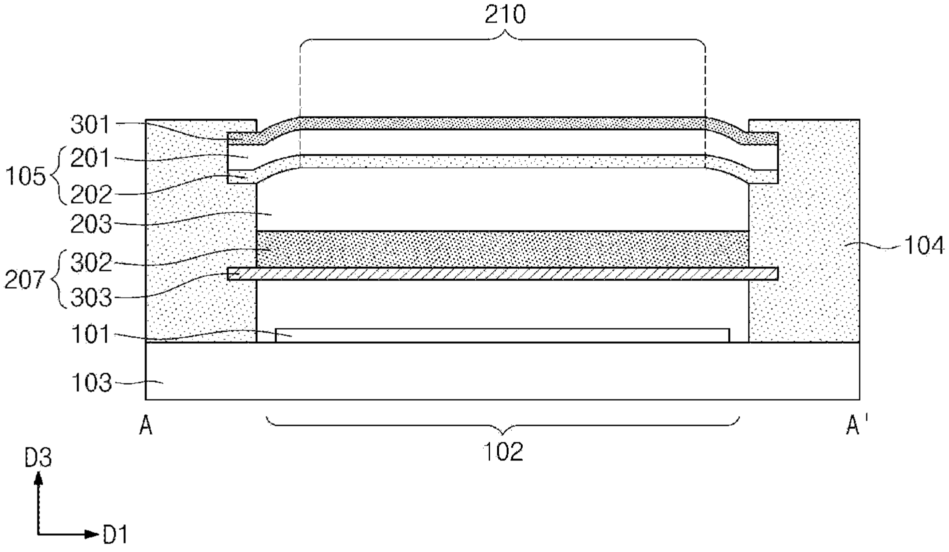

Referring to FIGS. 2D and 3D, if the temperature of the deformation part 201 is lowered to a specific temperature or less after the deformation part 201 is deformed by pressure, the deformation part 201 may recover the mechanical stiffness thereof and become rigid while maintaining its deformed shape. Accordingly, even if pressure is no longer applied to the chamber 203, the flexible layer 105 may maintain a deformed shape (protruding button shape) as it is. In other words, if the temperature is lowered to the specific temperature or less by removing the light 306 while maintaining pressure on the deformation part 201 whose shape has been deformed, the deformation part 201 recovers mechanical stiffness thereof and solidifies.

A method for returning the shape-variable display to the initial state illustrated in FIGS. 2A and 3A will be further described. As previously described with reference to FIGS. 2B and 3B, the deformation part 201 may be made flexible by heating the deformation part 201 through the light source part 101. When heating the deformation part 201 through the light source part 101 in a state where pressure is not applied to the chamber 203, the flexible deformable part 201 may be restored to its original shape by the elastic properties of the photo-thermal response part 202. In other words, due to the elasticity of the photo-thermal response part 202, the deformation part 201 receives a force in the opposite direction (opposite direction to D3) in which the deformation is made and thus is restored to its original shape. If the temperature of the deformation part 201 is lowered to a specific temperature or less after the deformation part 201 is restored to its original shape, the deformation part 201 may become rigid while maintaining the restored shape.

Figure 5:
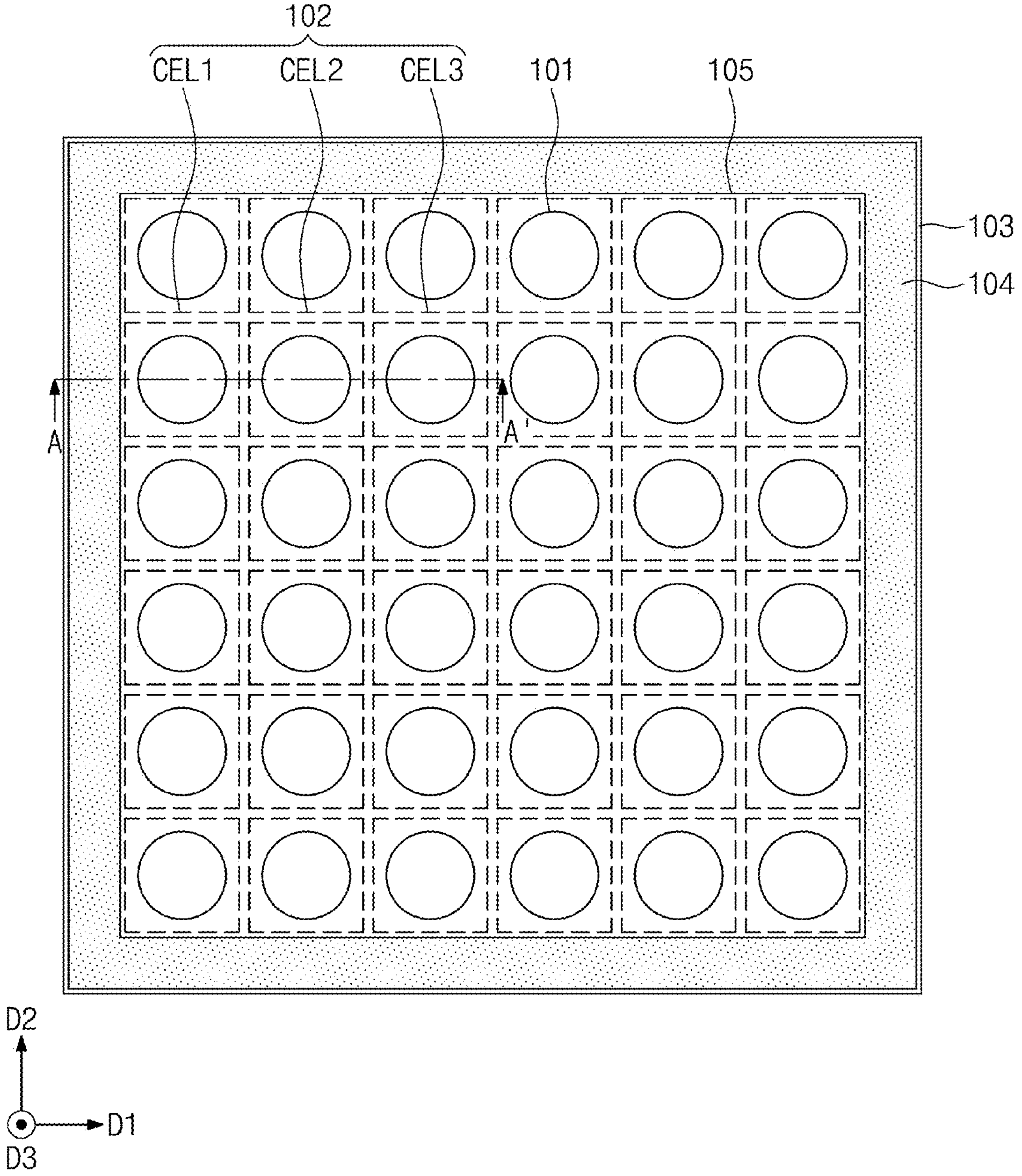
FIG. 5 is a plan view for describing a shape-variable display according to another embodiment of the inventive concept.
Figure 6:
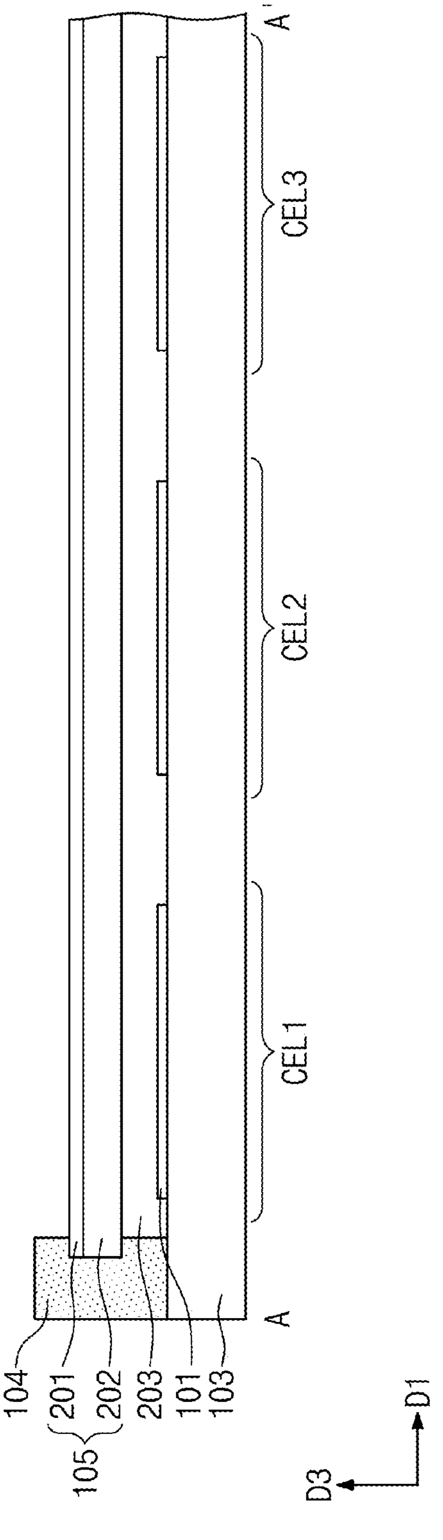
FIG. 6 is a cross-sectional view taken along line A-A' in FIG. 5.
Figure 7:
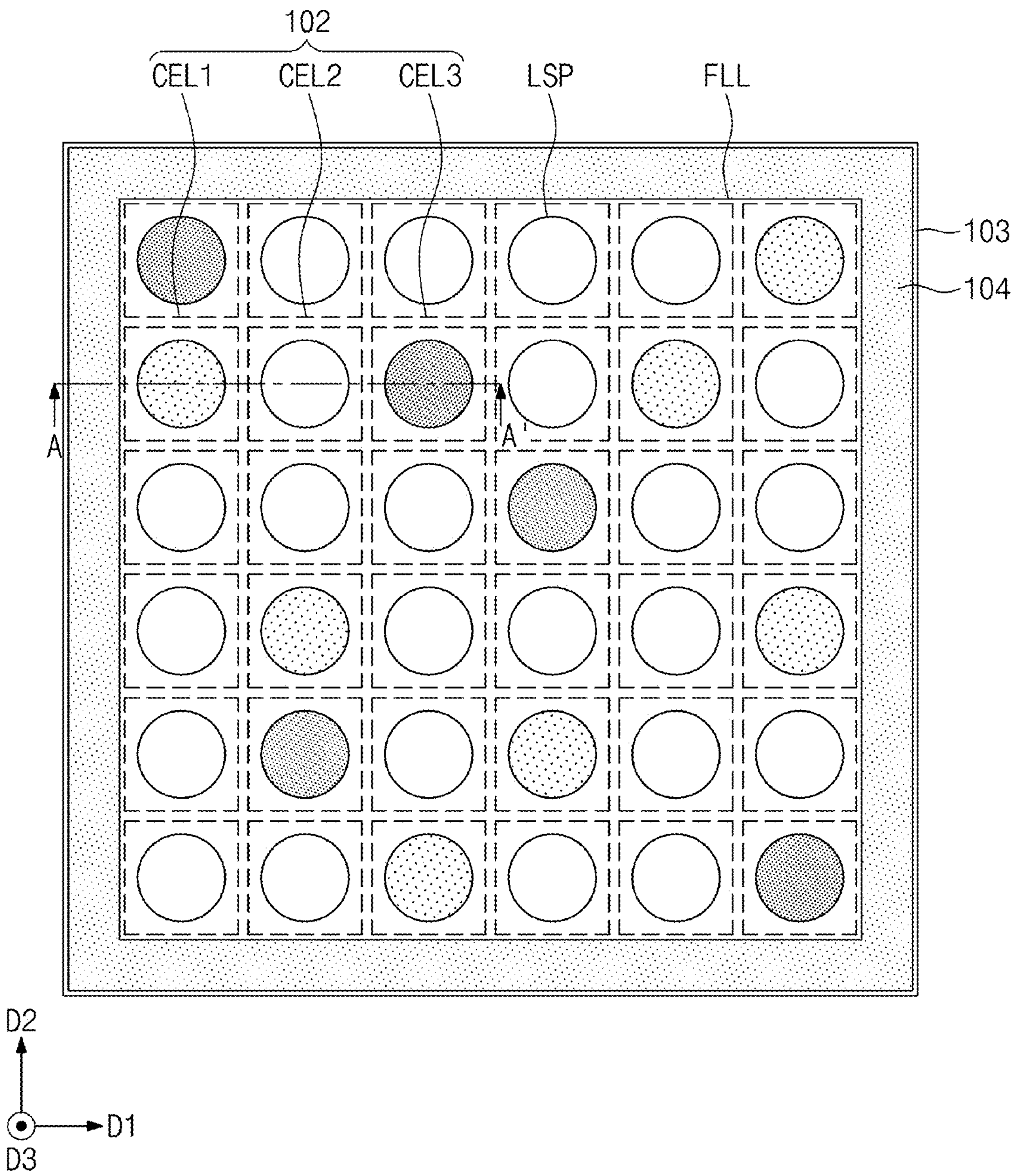
FIG. 7 is a plan view for describing an operation of the shape-variable display of FIG. 5.
Figure 8:
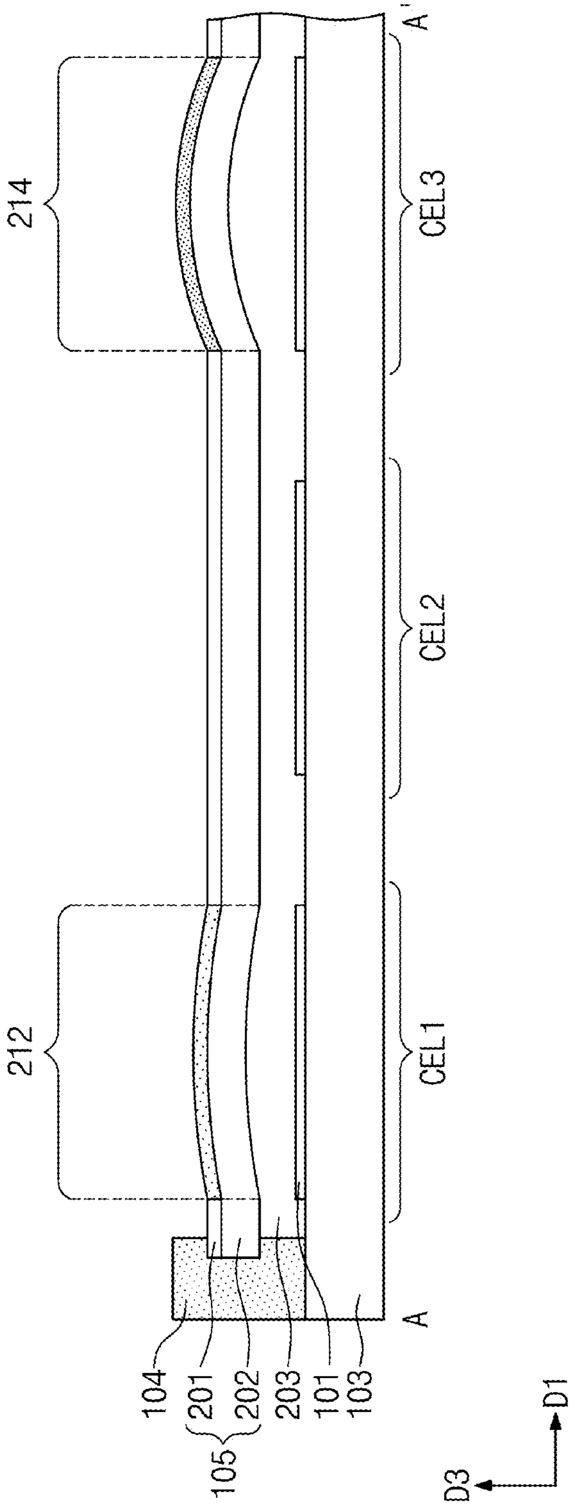
FIG. 8 is a cross-sectional view taken along line A-A' in FIG. 7.

FIG. 5 is a plan view for describing a shape-variable display according to another embodiment of the inventive concept. FIG. 6 is a cross-sectional view taken along line A-A' in FIG. 5. FIG. 7 is a plan view for describing the operation of the shape-variable display of FIG. 5. FIG. 8 is a cross-sectional view taken along line A-A' in FIG. 7. In this embodiment, description of technical features overlapping with those previously described with reference to FIGS. 1 to 4 will be omitted, and differences therebetween will be described in detail.

Referring to FIGS. 5 and 6, the substrate SUB having a plurality of cell regions 102 may be provided. The cell regions 102 may be two-dimensionally arranged along a first direction D1 and a second direction D2. The cell regions 102 may constitute a two-dimensional array. For example, the cell regions 102 may include first, second, and third cell regions CEL1, CEL2, and CEL3 arranged side by side in the first direction D1.

Light source units 101 may be respectively provided on the cell regions 102. As an example, the light source parts 101 may have the same size and shape. As another example, the light source parts 101 may have different sizes and shapes.

The support part 104 may be provided on the substrate 103. From a plan view, the support part 104 may surround the plurality of cell regions 102. That is, one support part 104 may define a plurality of cell regions 102.

One flexible layer 105 may be provided on the plurality of cell regions 102. The flexible layer 105 may be provided on the plurality of cell regions 102 and may extend in the horizontal directions (i.e., first direction D1 and second direction D2) across the plurality of cell regions 102. From a plan view, the flexible layer 105 may overlap the plurality of cell regions 102 and the plurality of light source parts 101.

The flexible layer 105 may be spaced apart from the light source parts 101 in the third direction D3 by the support part 104. The flexible layer 105 may include the photo-thermal response part 202 and the deformation part 201 that are sequentially stacked.

Referring to FIGS. 7 and 8, light is emitted from some of the light source parts 101, and the shape of the flexible layer 105 on some of the cell regions 102 may change. For example, light may be emitted from the light source parts 101 on the first and third cell regions CEL1 and CEL3. The mechanical stiffness of the flexible layer 105 on the first and third cell regions CEL1 and CEL3 may decrease. In other words, the flexible layer 105 on the first and third cell regions CEL1 and CEL3 may be made flexible. Meanwhile, the mechanical stiffness of the flexible layer 105 on the second cell region CEL2 may be maintained as it is. In other words, the flexible layer 105 on the second cell region CEL2 may remain rigid as it is.

As previously described with reference to FIGS. 2C and 3C, if pressure is applied, the shape of the flexible layer 105, which is made flexible, on the first and third cell regions CEL1 and CEL3 may be deformed. A first protruding region 212 and a second protruding region 214 may be formed in the flexible layer 105 on the first and third cell regions CEL1 and CEL3, respectively.

Meanwhile, since the flexible layer 105 on the second cell region CEL2 is in a rigid state, the shape of the flexible layer 105 may not change even when pressure is applied. Accordingly, a protruding region may not be formed on the second cell region CEL2.

Referring to FIGS. 7 and 8 again, the shape of the flexible layer 105 on the cell regions 102 may be changed differently depending on the intensity of light emitted from the light source parts 101. For example, the intensity of light emitted from the light source part 101 on the third cell region CEL3 may be stronger than the intensity of light emitted from the light source part 101 on the first cell region CEL1. The mechanical stiffness of the flexible layer 105 on the third cell region CEL3 may be significantly decreased than the mechanical stiffness of the flexible layer 105 on the first cell region CEL1. In other words, the flexible layer 105 on the third cell region CEL3 may be made more flexible than the flexible layer 105 on the first cell region CEL1.

Therefore, when the same pressure is applied, the degree of deformation of the flexible layer 105 on the third cell region CEL3 may be greater than the degree of deformation of the flexible layer 105 on the first cell region CEL1. That is, the second protruding region 214 formed in the flexible layer 105 on the third cell region CEL3 may be formed to be higher in the D3 direction than the first protruding region 212 formed in the flexible layer 105 on the first cell region CEL1.

As described above, if the temperature of the flexible layer 105 is lowered to a specific temperature or less after the flexible layer 105 is deformed by pressure, the flexible layer 105 may become rigid while maintaining its deformed shape. Accordingly, even if pressure is no longer applied, the flexible layer 105 may maintain the deformed shape as it is.

After the flexible layer 105 is solidified into the deformed shape, pressure may be applied again and light may be emitted from some of the light source parts 101. In this case, in a state where the deformed shape of the flexible layer 105 is maintained, the mechanical stiffness of only the flexible layer 105 on the cell regions 102 including the light source part 101 that emits light may be decreased. For example, after solidifying the flexible layer 105 in the form illustrated in FIGS. 7 and 8, pressure may be applied to the chamber to emit light only from the light source part 101 on the first cell region CEL1. In this case, only the mechanical stiffness of the flexible layer 105 on the first cell region CEL1 may be decreased. The mechanical stiffness of the flexible layer 105 on the second and third cell regions CEL2 and CEL3 to which light is not emitted from the light source part 101 may be maintained as it is.

The flexible layer 105 on the first cell region CEL1 of which mechanical stiffness is decreased, that is, flexibility is increased, may be deformed when force is applied from the outside of the flexible layer 105. As the intensity of light emitted from the light source part 101 on the first cell region CEL1 becomes stronger, the mechanical stiffness of the flexible layer 105 on the first cell region CEL1 is lowered, and thus the degree of deformation thereof may be increased when force is applied from the outside. That is, the texture of the flexible layer 105 felt outside the flexible layer 105 may vary depending on the intensity of light emitted from the light source part 101.

Furthermore, the warmth felt outside the flexible layer 105 on the first cell region CEL1 may vary depending on the intensity of light emitted from the light source part 101 on the first cell region CEL1. As the intensity of light emitted from the light source part 101 on the first cell region CEL1 becomes stronger, the magnitude of thermal energy emitted from the photo-thermal response part 202 on the first cell region CEL1 may increase. Therefore, the temperature felt outside the flexible layer 105 on the first cell region CEL1 may be high.

In this way, by controlling the on/off of each light source part 101, the warmth and texture of the flexible layer 105 may be locally adjusted.

In the shape-variable electronic device according to an embodiment of the inventive concept, a plurality of supports SUP are provided on the substrate SUB to surround each cell region CEL in a single grid form. In this case, since the support part SUP in the form of a partition wall is disposed between adjacent cell regions CEL, deformation may be independently applied on a cell-by-cell basis. For example, through precise deformation on a cell-by-cell basis, information for various purposes, such as three-dimensional shapes, characters, Braille, and UI, may be three-dimensionally expressed and delivered.

In a shape-variable electronic device according to another embodiment of the inventive concept, one flexible layer 105 supported by one support part 104 may be disposed on the plurality of cell regions 102. In other words, there may be no support part 104 in the form of the partition wall between adjacent cell regions 102. Since the support part 104 is reduced, an area of the shape-changing device may be decreased, and the expression a three-dimensional shape having a curved form, and a micro-surface structure may be possible.

Figure 11A:
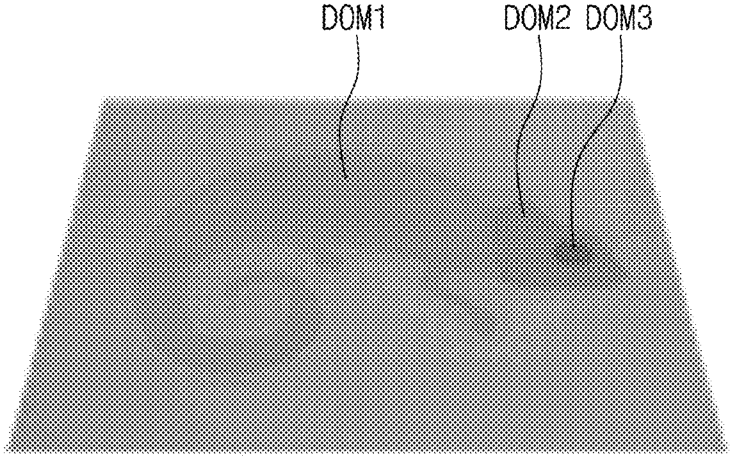
FIGS. 11A to 11D are diagrams illustrating an example of a shape-variable display according to an embodiment of the inventive concept.

The method of expressing the three-dimensional shape having the curved form and the micro-surface structure will be described with reference to FIG. 11. Referring to FIG. 11A, after drawing a two-dimensional drawing of a shape to be expressed, the shape may be divided into three specific regions DOM1, DOM2, and DOM3 and the regions DOM1, DOM2, and DOM3 may be heated to different temperatures. In this case, the mechanical stiffness of each of the regions DOM1, DOM2, and DOM3 may be differently decreased depending on the intensity of light applied. That is, the mechanical stiffness of the third region DOM3 irradiated with the strongest light may be decreased the most and the mechanical stiffness of the first region DOM1 irradiated with the weakest light may be decreased the least.

Figure 11B:
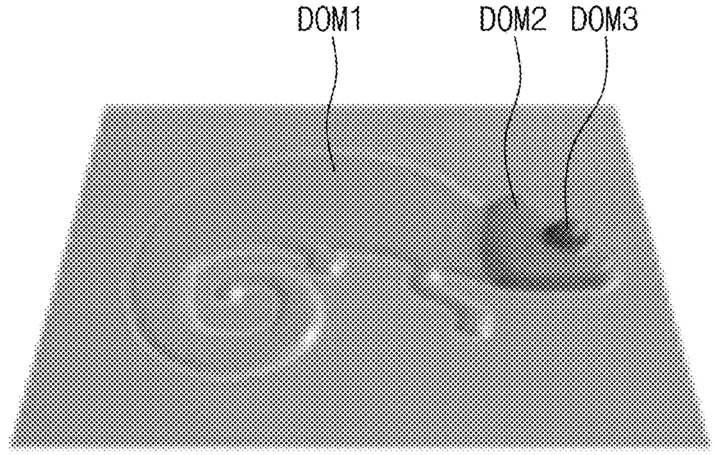

Referring to FIG. 11B, pressure may be applied to the flexible layer 105 of which mechanical stiffness is decreased. The third region DOM3 of which the mechanical stiffness has decreased the most may have a large degree of change in shape due to pressure, and the first region DOM1 of which the mechanical stiffness has decreased the least may have a small degree of change in shape due to pressure.

Figure 11C:
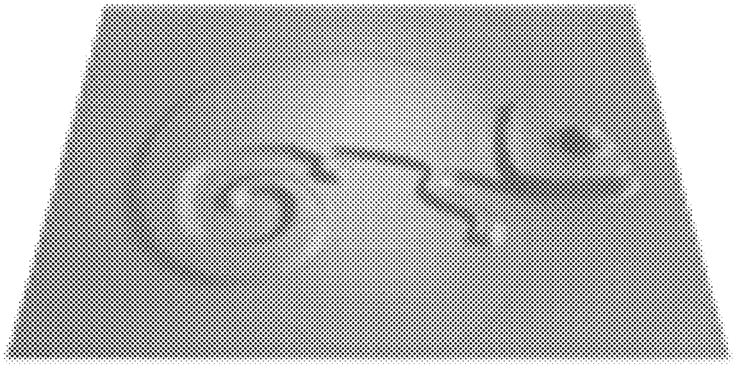

Referring to FIG. 11C, light applied from the light source part 101 may be removed while maintaining pressure on the flexible layer 105 whose shape has been deformed. If the temperature of the flexible layer 105 is lowered to a specific temperature or less, the flexible layer 105 solidifies and may maintain its shape even when pressure is removed.

Figure 11D:
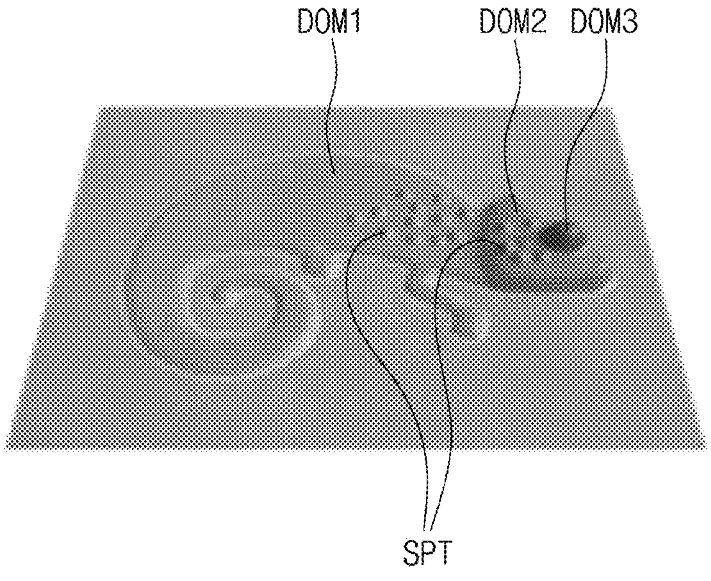

Referring to FIG. 11D, a fine curved structure may be expressed on the surface of the solidified three-dimensional structure by applying pressure again to the solidified flexible layer 105 and applying light only to a micro region SPT.

Figure 9:
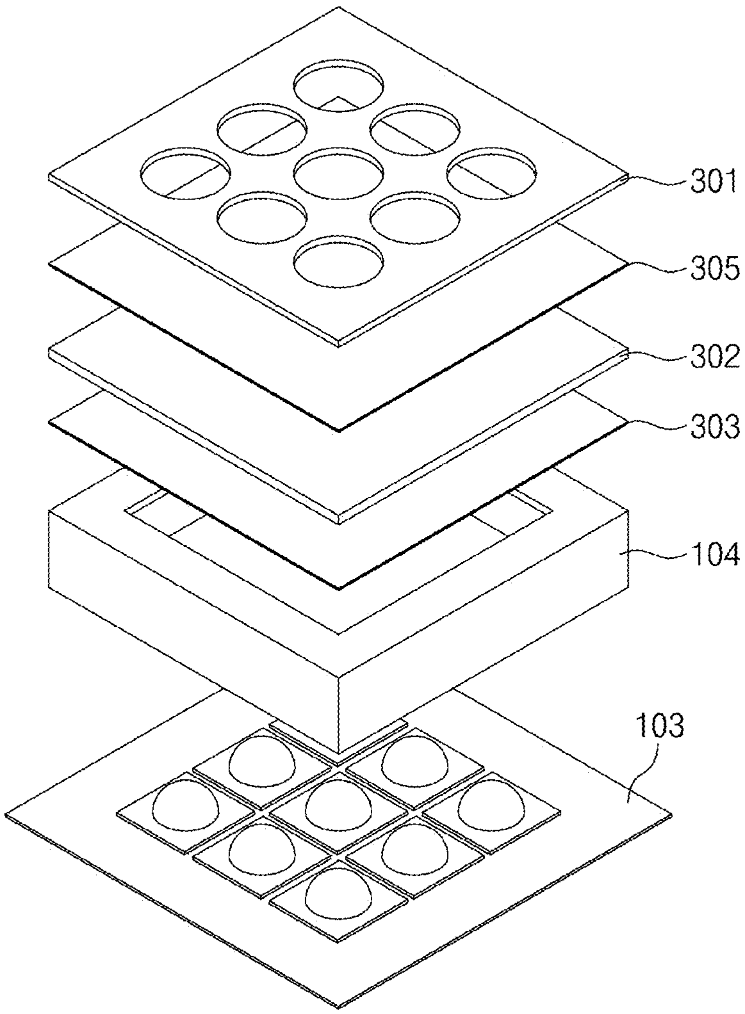
FIG. 9 is a perspective view illustrating an example of a shape-variable electronic device according to an embodiment of the inventive concept.

Referring to FIG. 9, one flexible layer 105 supported by the support part SUP may be disposed on the plurality of cell regions CEL, and a top frame layer TFR may be additionally disposed on the flexible layer 105. By the top frame layer TFR, the flexible layer 105 may be independently separated on a cell region CEL-by-cell region CEL basis, for example, the flexible layer 105 may be separated into spherical regions. Since there is no support part SUP in the form of the partition wall between the adjacent cell regions 102, the area of the device may be reduced, and also the flexible layer 105 may be independently deformed on a cell-by-cell basis. The top frame layer 301 may also serve to protect the flexible layer from external shock.

Although the embodiments of the inventive concept have been described with reference to the accompanying drawings, those of ordinary skill in the art to which the embodiment of the inventive concept pertains will understand that the embodiment of the inventive concept may be implemented in other specific forms without changing its technical idea or essential features. Therefore, it should be understood that the embodiments described above are illustrative and not restrictive in all respects.

The shape-variable electronic device according to an embodiment of the inventive concept may have a compact structure and may implement various shapes, warmth, and texture.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A shape-variable electronic device comprising:

a substrate having a first cell region and a second cell region;

a first light source part and a second light source part provided on the first cell region and the second cell region, respectively;

a flexible layer provided vertically spaced apart from the first and second light source parts;

a chamber between the first and second light source parts and the flexible layer; and a pressure control unit configured to adjust an internal pressure of the chamber, wherein the pressure control unit comprises:

a pipe configured to communicate with an inside of the chamber, and a pump configured to adjust an internal pressure of the chamber by being connected to the pipe, wherein the flexible layer comprises:

a photo-thermal response part configured to emit thermal energy by receiving light emitted from the first and second light source parts, and a deformation part of which mechanical stiffness is decreased by receiving the thermal energy from the photo-thermal response part, wherein the first and second light source parts are independently controlled such that the first light source part emits light having a first intensity, the second light source part emits light having a second intensity different from the first intensity, and a degree of decrease in mechanical stiffness of the deformation part on the first cell region is different from a degree of decrease in mechanical stiffness of the deformation part on the second cell region, and wherein both the deformation part on the first cell region and the deformation part on the second cell region are deformed, and a degree of deformation of the deformation part on the first cell region is different from a degree of deformation of the deformation part on the second cell region even when the internal pressure of the chamber is commonly applied to the first and second cell regions by the pressure control unit.

2. The device of claim 1, wherein the photo-thermal response part is a polymer film containing a light absorption heating element.

3. The device of claim 1, wherein the deformation part contains a physical properties-controllable polymer.

4. The device of claim 1, wherein:

the cell region comprises a plurality of cell regions arranged two-dimensionally, the light source part includes a plurality of light source parts respectively provided on the plurality of cell regions, and from a plan view, the flexible layer vertically overlaps the plurality of cell regions.

5. The device of claim 4, further comprising:

a support part configured to support the flexible layer, wherein, from a plan view, the support part surrounds the plurality of cell regions.

6. A shape-variable electronic device comprising:

a substrate having a first cell region and a second cell region;

a first light source part and a second light source part provided on the first cell region and the second cell region, respectively;

a flexible layer provided vertically spaced apart from the first and second light source parts;

a chamber between the first and second light source parts and the flexible layer; and a pressure control unit configured to adjust an internal pressure of the chamber, wherein the pressure control unit comprises:

a heating electrode between the light source part and the flexible layer, and a volatile layer on the heating electrode, wherein the flexible layer comprises:

a photo-thermal response part configured to emit thermal energy by receiving light emitted from the first and second light source parts, and a deformation part of which mechanical stiffness is decreased by receiving the thermal energy from the photo-thermal response part, wherein the first and second light source parts are independently controlled such that the first light source part emits light having a first intensity, the second light source part emits light having a second intensity different from the first intensity, and a degree of decrease in mechanical stiffness of the deformation part on the first cell region is different from a degree of decrease in mechanical stiffness of the deformation part on the second cell region, and wherein both the deformation part on the first cell region and the deformation part on the second cell region are deformed, and a degree of deformation of the deformation part on the first cell region is different from a degree of deformation of the deformation part on the second cell region even when the internal pressure of the chamber is commonly applied to the first and second cell regions by the pressure control unit.

7. The device of claim 6, wherein the heating electrode is heated by a Joule heating method to emit thermal energy.

8. The device of claim 6, wherein the heating electrode comprises a patterned metal.

9. The device of claim 6, wherein the heating electrode has a thickness of about 100 nm to about 1 μm.

10. An operation method of a shape-variable electronic device comprising a first light source part and a second light source part, a flexible layer on the first and second light source parts, a chamber between the first and second light source parts and the flexible layer, and a pressure control unit comprising a pipe and a pump to control an internal pressure of the chamber, the flexible layer including a photo-thermal response part and a deformation part, the method comprising:

emitting light from the first and second light source parts to the photo-thermal response part, the photo-thermal response part generating thermal energy when receiving the light;

heating the deformation part using the thermal energy, the deformation part being heated to decrease mechanical stiffness of the deformation part; and changing a shape of the deformation part by increasing the internal pressure with the pressure control unit, wherein the first and second light source parts are independently controlled such that the first light source part emits light having a first intensity, the second light source part emits light having a second intensity different from the first intensity, and a degree of decrease in the mechanical stiffness of the deformation part at a first cell region is different from a degree of decrease in the mechanical stiffness of the deformation part at a second cell region, and wherein both the deformation part on the first cell region and the deformation part on the second cell region are deformed, and a degree of deformation of the deformation part at the first cell region is different from a degree of deformation of the deformation part at the second cell region even when the internal pressure is commonly applied to the flexible layer by the pressure control unit.

11. The method of claim 10, wherein a shape of the flexible layer on a region not irradiated with light from the first and second light source parts does not change.

12. The method of claim 10, wherein the photo-thermal response part is a polymer film containing a light absorption heating element.

13. The method of claim 10, wherein the deformation part contains a physical properties-controllable polymer.

* * * * *